(12) United States Patent
Chen et al.

(10) Patent No.: US 11,257,713 B2
(45) Date of Patent: Feb. 22, 2022

(54) INTERPOSER BOARD WITHOUT FEATURE LAYER STRUCTURE AND METHOD FOR MANUFACTURING THE SAME

(71) Applicant: Zhuhai ACCESS Semiconductor Co., Ltd, Guangdong (CN)

(72) Inventors: Xianming Chen, Guangdong (CN); Min Gu, Guangdong (CN); Benxia Huang, Guangdong (CN); Lei Feng, Guangdong (CN); Bingsen Xie, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 3 days.

(21) Appl. No.: 17/073,968

(22) Filed: Oct. 19, 2020

(65) Prior Publication Data
US 2021/0391213 A1 Dec. 16, 2021

(30) Foreign Application Priority Data
Jun. 12, 2020 (CN) .......................... 202010536963.9

(51) Int. Cl.
| H01L 21/768 | (2006.01) |
| H01L 23/532 | (2006.01) |
| H01L 23/14 | (2006.01) |
| H01L 23/48 | (2006.01) |
| H01L 21/48 | (2006.01) |

(52) U.S. Cl.
CPC ...... *H01L 21/76879* (2013.01); *H01L 21/486* (2013.01); *H01L 21/76816* (2013.01); *H01L 23/14* (2013.01); *H01L 23/481* (2013.01); *H01L 23/53228* (2013.01)

(58) Field of Classification Search
CPC ............. H01L 21/76879; H01L 21/486; H01L 21/76816; H01L 23/14; H01L 23/481; H01L 23/53228
See application file for complete search history.

(56) References Cited

U.S. PATENT DOCUMENTS

2018/0310417 A1* 10/2018 Lin ...................... H05K 3/4007

\* cited by examiner

*Primary Examiner* — Quoc D Hoang
(74) *Attorney, Agent, or Firm* — The PL Law Group, PLLC

(57) ABSTRACT

A method for manufacturing an interposer board without a feature layer structure according to an embodiment of the present invention may include preparing a temporary carrier; forming an edge seal for the temporary carrier; laminating an insulating material onto upper and lower surfaces of the temporary carrier to form an insulating layer; forming a via on the insulating layer, filling the via with a metal; and removing the edge seal and removing the temporary carrier. An interposer board without a feature layer structure according to an embodiment of the present invention may include an insulating layer and a via-post layer embedded in the insulating layer, wherein the via-post has an end used as a pad.

17 Claims, 6 Drawing Sheets

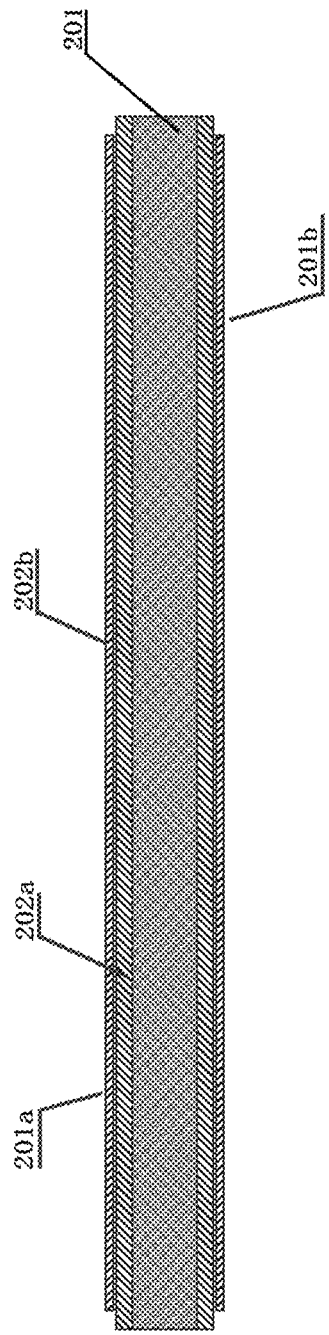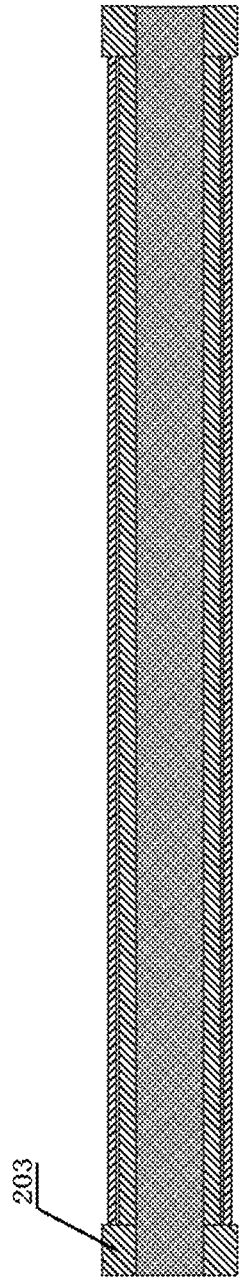
Fig. 5(a)
Fig. 5(b)

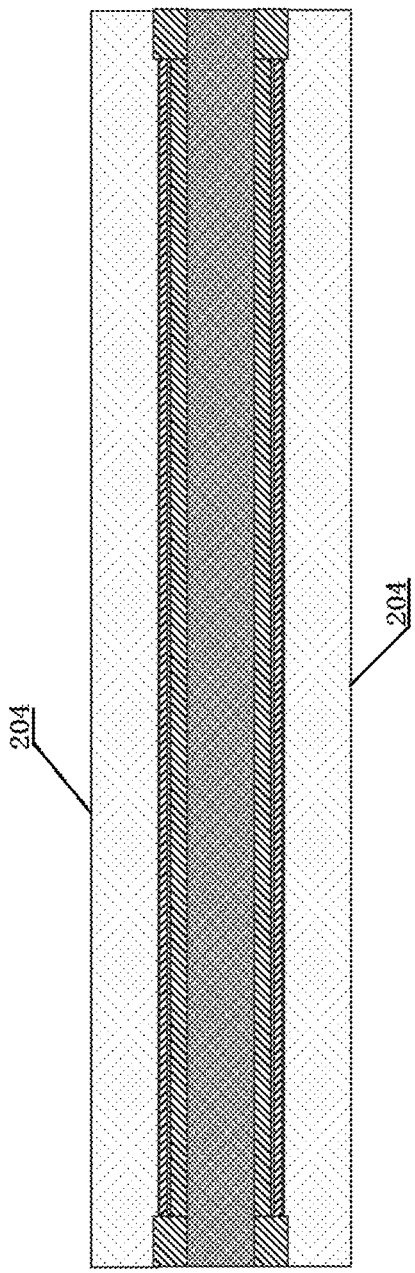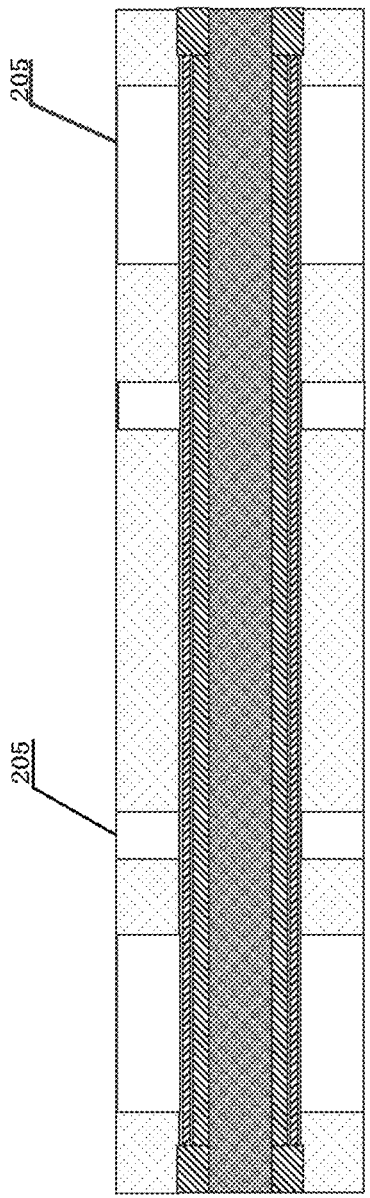
Fig. 5(c)
Fig. 5(d)

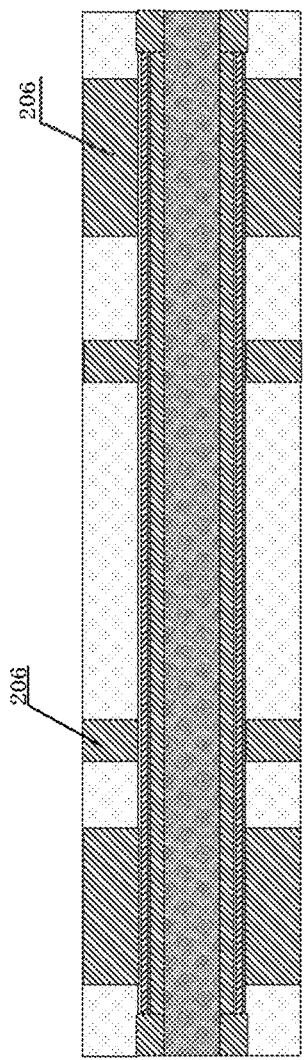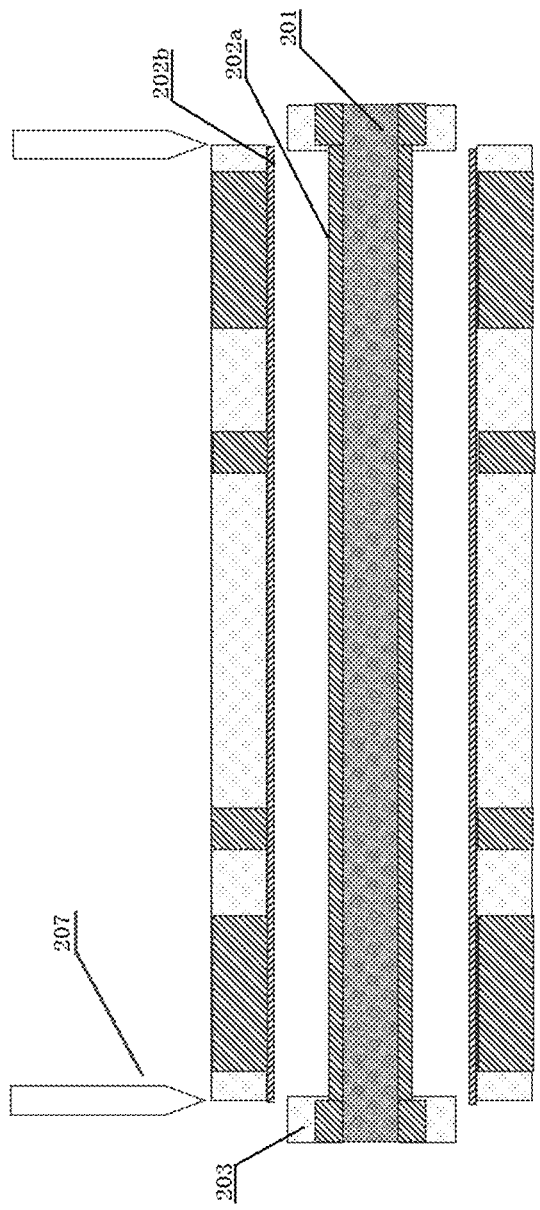
Fig. 5(e)
Fig. 5(f)

INTERPOSER BOARD WITHOUT FEATURE LAYER STRUCTURE AND METHOD FOR MANUFACTURING THE SAME

CROSS-REFERENCE TO RELATED APPLICATION AND CLAIM OF PRIORITY

This application claims priority to Chinese Patent Applications No. 202010536963.9 filed on Jun. 12, 2020 in the Chinese Intellectual Property Office, the entire disclosure of which is incorporated by reference herein.

BACKGROUND

1. Field of the Invention

The present invention relates to an interposer board without a feature layer structure and a method for manufacturing the same.

2. Description of the Related Art

In the electronics industry, especially in the consumer electronics industry, for the miniature function devices, such as audio PA switches, LED drivers, RF LNA/GPS/LDO, controllers, etc., there is an increasing requirement for miniaturization. Generally, the miniaturization is achieved by increasing the IO (input/output) number. However, there is a limit for wiring with the common interposer carrier (organic carrier board and lead frame), and the IO number cannot be increased any more.

In the industry now, for the interposer boards used in the wafer 3D stacking structure, such as TGV (through glass via) interposer board, TSV (through silicon via) interposer board, or for the package substrate interposer board, the via is used to connect the feature layers of the upper and lower layers, constituting a three-layer structure, wherein the features are used as the pads for wire bonding and solder balls.

For this type of prior interposer board, the available minimum spacing between the features restricts the potential of further miniaturization. FIG. 1 shows an example of the prior interposer board. FIG. 1 shows the SEM photos of via-posts after via-forming and before electroplating. As shown in FIG. 1, when the via-post has a diameter of 100 µm, the spacing between the vias is 45 µm; and when the diameter of the via-post is reduced to 60 µm, the spacing between the vias is 30 µm. However, when further forming the feature layer, taking the best LDI exposure machine in the industry (laser direct imaging) as an example, the positioning alignment limiting in the current interposer board industry is 20 µm and the resolution limiting line width/line spacing is 15/15 µm. That is, when the Cu via-post has a diameter of 100 µm and the spacing between the vias is 45 µm, the diameter of the pad in the feature layer is 140 µm and the spacing between adjacent pads is only 5 µm. Such spacing has been beyond the maximum limit of apparatus resolution in the current interposer board industry.

When the minimum spacing of the feature layer is still less than the resolution limit of the apparatus, the only method is to make the pad extend outwards (to all around) by re-wiring. This results in the products with a larger size, violating the developing trend of miniaturization in the market. Also as shown in FIG. 1, in the presence of the feature layer, the length size necessary for adjacent pads is calculated as 140 µm (diameter of one pad)+140 µm (diameter of another pad)+15 µm (minimum spacing between pads)=295 µm. However, if the feature layer is eliminated, the length size between adjacent via-posts is calculated as 100 µm+100 µm+45 µm=245 µm. That is, in a single direction, the elimination of the feature layer can efficiently save 17% length.

Also, due to the limitation on alignment capability between the via-post and the feature layer, the feature layer must be larger in size than the via-post. The spare portion depends on the alignment capability of the apparatus and is called "alignment transfer annular ring". On the devices, such as switches and RF devices, repeated switching on/off and frequency conversion will inevitably generate a parasitic capacitance. FIG. 2 is a structural schematic view of an interposer board in the prior art. As shown in FIG. 2, the upper feature layer is named as M1 layer and the lower feature layer is named as M2 layer. When a current (or electric signal) flows from M1 layer through the Cu via-post to M2 layer, the circuit may be equivalent to what is shown in FIG. 3.

The presence of the parasitic inductor L12 will cause unnecessary heat generation of the devices during operation. The high operation temperature of the product will shorten its use life indirectly. The presence of the parasitic capacitors C1 and C2 will cause loss of electric signals in the insulating layer, and the charging process of the parasitic capacitors will cause transfer delay of electric signals. The parasitic inductance L12 may be reduced as the transmission line is shortened, and the parasitic capacitances of C1 and C2 may be reduced as the alignment annular ring is reduced.

SUMMARY

The embodiments of the present invention involve providing a solution for an interposer board without a feature layer structure.

A first aspect of the present invention relates to a method for manufacturing an interposer board without a feature layer structure, comprising:
(a) preparing a temporary carrier;
(b) forming an edge seal for the temporary carrier;
(c) laminating an insulating material onto upper and lower surfaces of the temporary carrier to form an insulating layer;
(d) forming a via on the insulating layer;
(e) filling the via with a metal; and
(f) removing the edge seal and removing the temporary carrier.

In some embodiments, the temporary carrier comprises a double-layer Cu clad laminate (CCL), i.e. an insulating plate which is covered on its upper and lower surfaces with respective double copper foils.

In some embodiments, the temporary carrier comprises a first Cu foil on a surface of the insulating plate and a second Cu foil on a surface of the first Cu foil, with the second Cu foil having a thickness of 0.8 µm~5 µm.

In some embodiments, the step (b) comprises: covering a periphery of the temporary carrier with a covering material. The covering material may be Cu.

In some embodiments, the insulating material in the step (c) comprises: polyimide, epoxy resin, BT (bismaleimide/triazine) resin, polyphenylene oxide, polyacrylate, prepreg, Ajinomoto buildup film, or the combination thereof.

In some embodiments, the step (d) comprises: forming the via on the insulating layer by a manner of laser, mechanical or lithographic via-opening.

In some embodiments, the step (e) comprises: filling the via by a manner of electroplating or chemical plating.

In some embodiments, the metal for filling in the step (e) is Cu, thus forming a Cu via-post.

In some embodiments, the step (f) comprises: removing the edge seal by a milling cutter.

According to another aspect of the present invention, an interposer board without a feature layer structure is provided, prepared by the method for manufacturing an interposer board without a feature layer structure as described above.

In some embodiments, the interposer board comprises an insulating layer and a via-post layer embedded in the insulating layer.

In some embodiments, the insulating layer comprises: polyimide, epoxy resin, BT (bismaleimide/triazine) resin, polyphenylene oxide, polyacrylate, prepreg, Ajinomoto buildup film, or the combination thereof.

In some embodiments, the via-post layer comprises at least one Cu via-post.

In some embodiments, the via-post layer comprises via-posts with different sizes.

In some embodiments, the via-post has an end flush with or higher than the insulating layer.

The term "$\mu m$" refers to $10^{-6}$ meter.

BRIEF DESCRIPTION OF THE DRAWINGS

In order to better understand the present invention and illustrate the embodiments of the present invention, the accompanying drawings are referred to only in an exemplary way.

Specifically referring to the drawings, it should be emphasized that the specific graphical representation is provided only in an exemplary way, and only for the purpose of illustrative discussion of the preferred embodiments of the present invention. The graphical representation is provided for the reason that the drawings are believed to be useful to make the description of the principles and concepts of the present invention understood easily. In this regard, it is intended to illustrate the structural details of the present invention only in a detail degree necessary to generally understand the present invention. The several solutions of the present invention embodied in practice can be appreciated by those skilled in the art with the specific explanation referring to the drawings. In the drawings:

FIGS. 5(a)-(f) show schematic section views for the manufacturing steps of the interposer board without feature layer structure shown in FIG. 4.

DETAILED DESCRIPTION

Figure 1:
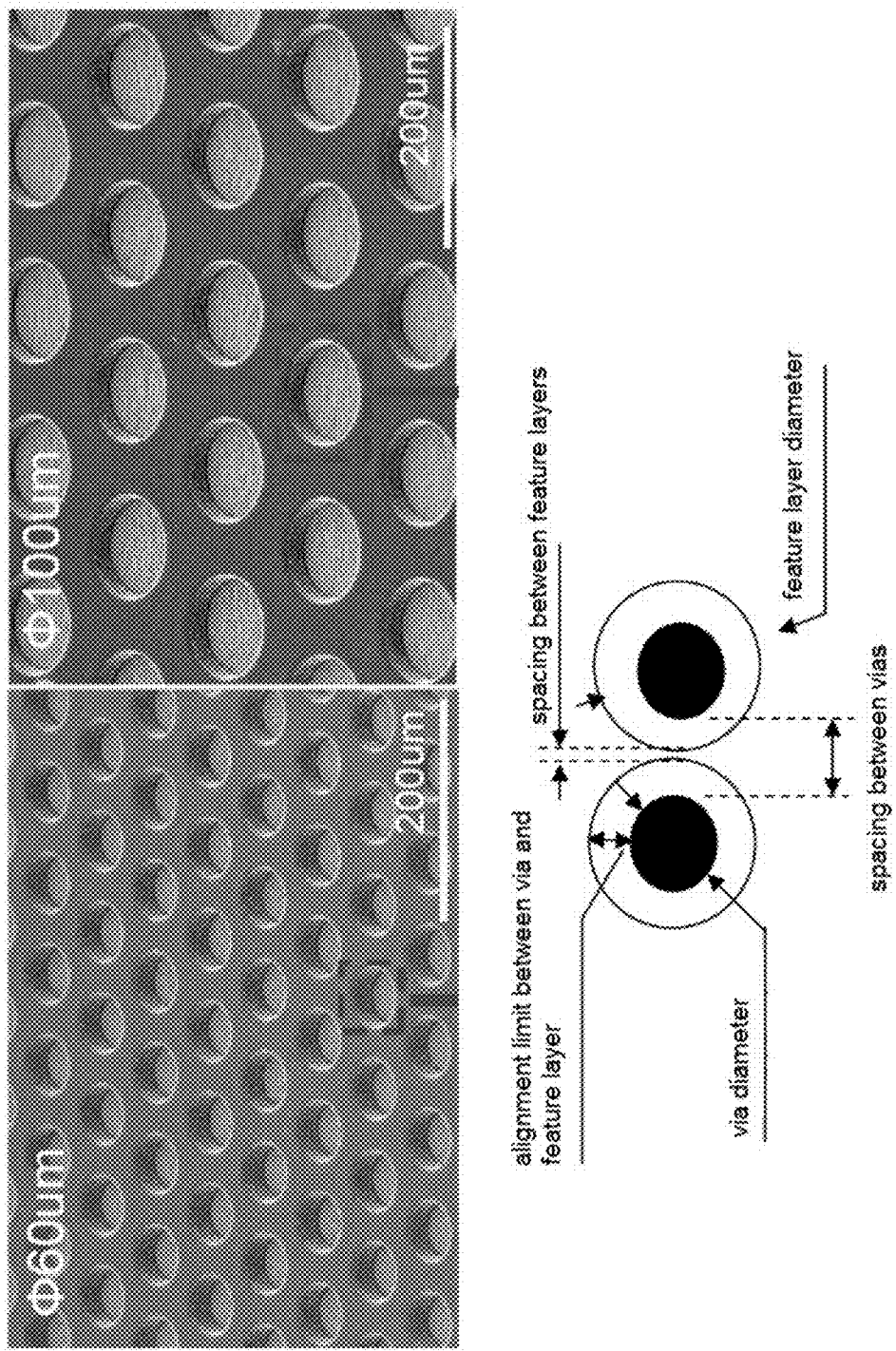
FIG. 1 shows an interposer board in the prior art wherein SEM photos of via-posts after via-forming and before electroplating are shown.
Figure 2:
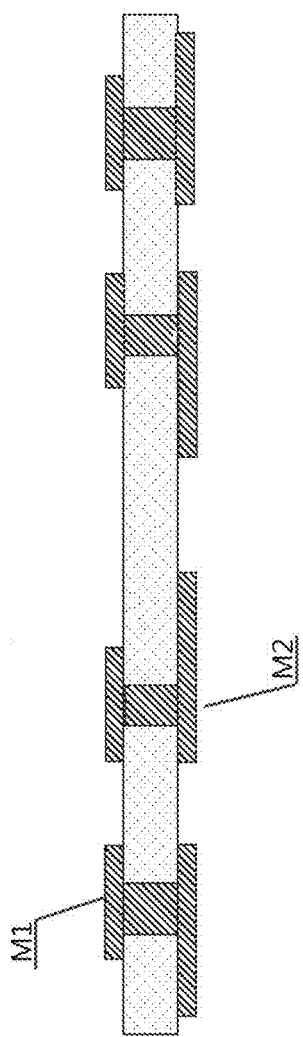
FIG. 2 is a schematic section view of an interposer board in the prior art.
Figure 3:
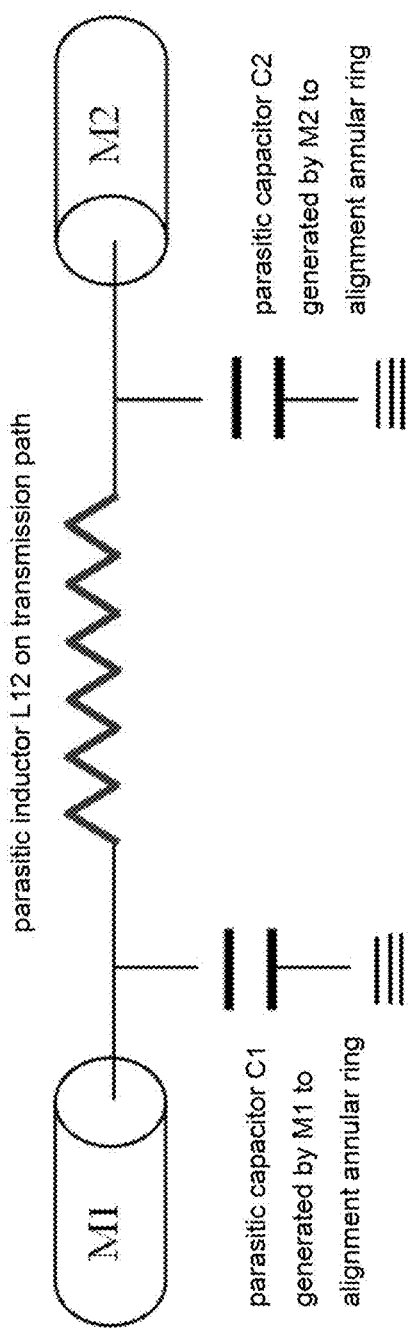
FIG. 3 is a circuit equivalent diagram of the interposer board in FIG. 2.
Figure 4:
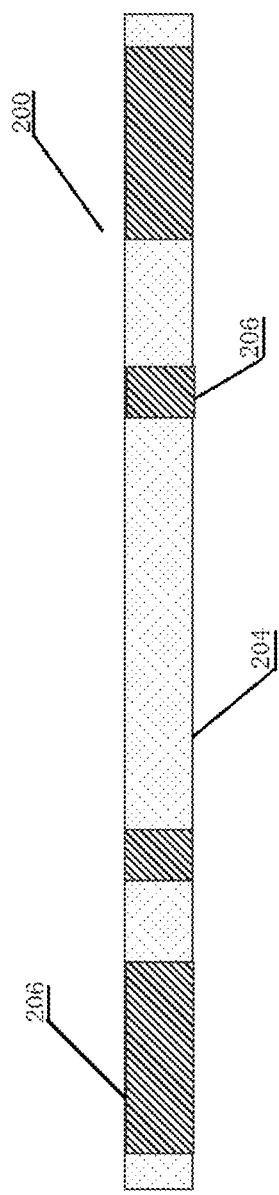
FIG. 4 is a schematic section view of an interposer board without a feature layer structure according to an embodiment of the present invention.

Referring to FIG. 4, it shows a schematic section view of an interposer board without a feature layer structure according to the present invention. The interposer board 200 comprises an insulating layer 204 and a Cu via-post 206 embedded in the insulating layer 204. The Cu via-post 206 has an end which is substantially same in size as its portion embedded in the insulating layer 204. The end of the Cu via-post 206 may be flush with the insulating layer 204, or may be higher than the insulating layer 204. Generally, the interposer board 200 has multiple Cu via-posts 206 as the interposing TO channels. The multiple Cu via-posts 206 may be same or different with one another in size. The Cu via-posts 206 are spaced with one another in the insulating layer 204 such that the ends thereof can be used as connecting pads.

Referring to FIGS. 5(a)-(f), a method for manufacturing an interposer board without a feature layer structure comprises the following steps: preparing a temporary carrier 201 (step 5a), as shown in FIG. 5(a). The temporary carrier 201 is generally an insulating board which is covered on its upper surface 201a and lower surface 201b with respective double Cu foils. The double Cu foils comprise a first Cu foil 202a and a second Cu foil 202b physically laminated together. The first Cu foil 202a is in contact with the temporary carrier 201 and the second Cu foil 202b is attached to a surface of the first Cu foil 202a. The second Cu foil 202b has a thickness of 0.8 $\mu m$~5 $\mu m$.

The next step is forming an edge seal 203 for the temporary carrier 201 (step 5b), as shown in FIG. 5(b). Generally, the board peripheries of the upper surface 201a and the lower surface 201b of the temporary carrier 201 are covered with a metal to form the edge seals which seals a gap at the board peripheries. The covering material to be used may be Cu. The formation of the edge seal 203 can prevent delamination of the double Cu foils and liquid agent from remaining at the boundary of the double Cu foils during subsequent processes.

The next step is laminating an insulating material onto upper and lower surfaces of the temporary carrier 201 to form an insulating layer 204 (step 5c), as shown in FIG. 5(c). Generally, an insulating material is laminated onto the upper surface 201a and the lower surface 201b of the temporary carrier 201, respectively, to form an insulating layer. The insulating material to be used may be a polymer material, such as polyimide, epoxy resin, BT (bismaleimide/triazine) resin, polyphenylene oxide, polyacrylate, prepreg (PP), Ajinomoto buildup film (ABF), or the combination thereof, and it may be a photosensitive insulating material.

The next step is forming a via 205 on the insulating layer 204 (step 5d), as shown in FIG. 5(d).

The step 5d of forming a via 205 on the insulating layer 204 may be achieved by a manner of laser via-opening, mechanical via-opening, or lithographic via-opening to form a via 205 on the insulating layer 204.

The next step is filling the via 205 (step 5e), as shown in FIG. 5(e). Generally, the via 205 may be filled with a metal by a manner of electroplating or chemical plating, to form a metal via-post 206. The metal used for electroplating may be Cu, thus forming a Cu via-post 206.

The next step is removing the edge seal 203 and removing the temporary carrier 201 (step 5f), as shown in FIG. 5(f). After the Cu via-post 206 and the insulating layer 204 are used to provide a higher rigidity for the structure 200, the temporary carrier 201 may be removed. Generally, before removing the temporary carrier 201, it is necessary to first remove the edge seals 203 and it is possible to remove the edge seals 203 by a milling cutter 207. Then, the first and second Cu foils are separated to remove the temporary carrier 201.

After removing the temporary carrier 201, it is possible to remove the second Cu foil 202b by etching, thus obtaining the interposer board 200 without a feature layer. During preparation of the Cu via-post 206 by electroplating, a stress may be generated such that the interposer board 200 without a feature layer is warped in a direction opposite to the temporary carrier 201. After removing the second Cu foil 202b, it is possible to release the stress by baking to make the board face flat. Then, it is possible to perform grinding to the board face, apply a solder mask and expose the via-post end as the pad.

In the present invention, by omitting the feature layer in the interposer board in the prior art and by using the via-post in the coreless interposer board as the interposing IO channel and pad, the spacing between the pads of the interposer board can be further decreased, breaking the apparatus resolution limit, thereby significantly increasing the IO channels per unit area of the interposer board, further saving the space on PCB, and thus achieving a higher integration density.

It will be appreciated by those skilled in the art that the present invention is not limited to the contents as specifically illustrated and described above. Moreover, the scope of the present invention is defined by the appended claims, comprising combinations and sub-combinations of the various technical features as described above as well as the variations and modifications thereof, which can be anticipated by those skilled in the art by reading the above description.

In the claims, the term "comprise" and its variations, such as "comprises", "comprising", etc., mean that the element(s) as listed will be included, generally without excluding other element(s).

What is claimed is:

1. A method for manufacturing an interposer board without a feature layer structure, comprising the following steps:
   (a) preparing a temporary carrier;
   (b) forming an edge seal for the temporary carrier;
   (c) laminating an insulating material onto upper and lower surfaces of the temporary carrier to form an insulating layer;
   (d) forming a via on the insulating layer;
   (e) filling the via with a metal; and
   (f) removing the edge seal and removing the temporary carrier.

2. The method for manufacturing an interposer board without a feature layer structure according to claim 1, wherein the temporary carrier comprises an insulating plate which is covered on its upper and lower surfaces with respective double Cu foils.

3. The method for manufacturing an interposer board without a feature layer structure according to claim 2, wherein the temporary carrier comprises a first Cu foil on a surface of the insulating plate and a second Cu foil on a surface of the first Cu foil, with the second Cu foil having a thickness of 0.8 µm~5 µm.

4. The method for manufacturing an interposer board without a feature layer structure according to claim 2, wherein the step (b) comprises: covering a periphery of the temporary carrier with a covering material to seal a gap of the double Cu foils.

5. The method for manufacturing an interposer board without a feature layer structure according to claim 4, wherein the covering material in the step (b) is Cu.

6. The method for manufacturing an interposer board without a feature layer structure according to claim 1, wherein the insulating material in the step (c) comprises an organic electrically insulating material.

7. The method for manufacturing an interposer board without a feature layer structure according to claim 6, wherein the insulating material in the step (c) comprises: polyimide, epoxy resin, bismaleimide/triazine resin, polyphenylene oxide, polyacrylate, prepreg, Ajinomoto buildup film, or the combination thereof.

8. The method for manufacturing an interposer board without a feature layer structure according to claim 1, wherein the step (d) comprises: forming the via on the insulating layer by a laser, mechanical or lithographic manner.

9. The method for manufacturing an interposer board without a feature layer structure according to claim 1, wherein the step (e) comprises: filling the via by an electroplating or chemical plating manner.

10. The method for manufacturing an interposer board without a feature layer structure according to claim 1, wherein the metal for filling in the step (e) is Cu, thus forming a Cu via-post.

11. The method for manufacturing an interposer board without a feature layer structure according to claim 1, wherein the step (0 comprises: removing the edge seal by a milling cutter.

12. An interposer board without a feature layer structure, prepared by the method for manufacturing an interposer board without a feature layer structure according to claim 1.

13. The interposer board without a feature layer structure according to claim 12, comprising an insulating layer and a via-post layer embedded in the insulating layer.

14. The interposer board without a feature layer structure according to claim 13, wherein the insulating layer comprises: polyimide, epoxy resin, bismaleimide/triazine resin, polyphenylene oxide, polyacrylate, prepreg, Ajinomoto buildup film, or the combination thereof.

15. The interposer board without a feature layer structure according to claim 13, wherein the via-post layer comprises at least one Cu via-post.

16. The interposer board without a feature layer structure according to claim 13, wherein the via-post layer comprises via-posts with different sizes.

17. The interposer board without a feature layer structure according to claim 13, wherein the via-post has an end flush with or higher than the insulating layer.

\* \* \* \* \*